US011631471B2

(12) United States Patent
Long et al.

(10) Patent No.: US 11,631,471 B2
(45) Date of Patent: Apr. 18, 2023

(54) METHOD FOR GENERATING MEMORY PATTERN, COMPUTER-READABLE STORAGE MEDIUM AND DEVICE

(71) Applicant: CHANGXIN MEMORY TECHNOLOGIES, INC., Hefei (CN)

(72) Inventors: Guangteng Long, Hefei (CN); Lixia Zhang, Hefei (CN); Yinhuan Chu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 78 days.

(21) Appl. No.: 17/599,425

(22) PCT Filed: Apr. 9, 2021

(86) PCT No.: PCT/CN2021/086038
§ 371 (c)(1),
(2) Date: Sep. 28, 2021

(87) PCT Pub. No.: WO2021/232990
PCT Pub. Date: Nov. 25, 2021

(65) Prior Publication Data

US 2023/0077794 A1 Mar. 16, 2023

(30) Foreign Application Priority Data

May 19, 2020 (CN) ......................... 202010423910.6

(51) Int. Cl.
*G11C 29/36* (2006.01)
*G11C 29/12* (2006.01)
*G11C 29/18* (2006.01)

(52) U.S. Cl.
CPC .......... *G11C 29/36* (2013.01); *G11C 29/1201* (2013.01); *G11C 29/18* (2013.01); *G11C 2029/3602* (2013.01)

(58) Field of Classification Search
CPC ..... G11C 29/36; G11C 29/1201; G11C 29/18; G11C 2029/3602
See application file for complete search history.

(56) References Cited

U.S. PATENT DOCUMENTS 9,032,141 B2 5/2015 Bains et al.
9,058,897 B2 6/2015 Yu et al.
(Continued)

FOREIGN PATENT DOCUMENTS

CN 101772810 A 7/2010
CN 103187092 A 7/2013
(Continued)

OTHER PUBLICATIONS

International Search Report and English Translation as cited in PCT/CN2021/086038 dated Jul. 7, 2021, 11 pages.
(Continued)

*Primary Examiner* — Han Yang
(74) *Attorney, Agent, or Firm* — Cooper Legal Group, LLC

(57) ABSTRACT

The present disclosure relates to a method for generating a pattern of a memory, a computer-readable storage medium and a computer device, the method for generating a pattern of a memory includes: presetting mapping relationships between a physical address and a row, a column and a bank, and determining bits of the physical address corresponding to the row, the column and the bank; taking a preset number of values as setting data, the preset number being the same as a number of signal address lines in the memory; obtaining a command truth value table, which is used to define relationships between bits of the physical address and commands; determining values of the row, the column and the bank based on the command truth value table and the setting
(Continued)

presetting mapping relationships between a physical address and a row, a column and a bank, and determining bits of the physical address corresponding to the row, the column and the bank
S100
taking a preset number of values as setting data, the preset number being the same as a number of signal address lines in the memory
S200
obtaining a command truth value table, which is used to define relationships between bits of the physical address and commands
S300
determining values of the row, the column and the bank based on the command truth value table and the setting data
S400
generating the pattern based on the values of the row, the column and the bank and the mapping relationships
S500
inputting the pattern into the memory to perform a read-write test on the memory
S600 data; generating the pattern based on the values of the row, the column and the bank and the mapping relationships.

14 Claims, 5 Drawing Sheets

(56) References Cited

U.S. PATENT DOCUMENTS

| | | | | |
|---|---|---|---|---|
| 9,436,609 | B2 | 9/2016 | Eggleston | |
| 10,839,887 | B2 | 11/2020 | Cox et al. | |
| 10,997,068 | B1 * | 5/2021 | Ebsen | G11C 16/0483 |
| 2011/0007593 | A1 * | 1/2011 | Takano | G11C 11/406 365/230.03 |
| 2020/0110716 | A1 | 4/2020 | Mozak et al. | |

FOREIGN PATENT DOCUMENTS

| | | | |
|---|---|---|---|
| CN | 104737234 | A | 6/2015 |
| CN | 109791786 | A | 5/2019 |

OTHER PUBLICATIONS

Written Opinion and English Translation as cited in PCT/CN2021/086038 dated Jul. 7, 2021, 8 pages.

* cited by examiner

Table 2

| CMD | | CA0 | CA1 | CA2 | CA3 | CA4 | CA5 |
|---|---|---|---|---|---|---|---|
| Active-1 | A1-H | H | L | R12 | R13 | R14 | R15 |
| | A1-L | BA0 | BA1 | BA2 | R16 | R10 | R11 |
| Active-2 | A2-H | H | H | R6 | R7 | R8 | R9 |
| | A2-L | R0 | R1 | R2 | R3 | R4 | R5 |
| Write-1 | W1-H | L | L | H | L | L | BL |
| | W1-L | BA0 | BA1 | BA2 | V | C9 | AP |
| Read-1 | R1-H | L | H | L | L | L | BL |
| | R1-L | BA0 | BA1 | BA2 | V | C9 | AP |
| Write-2 | W2-H/R2-H | L | H | L | L | H | C8 |
| Read-2 | W2-L/R2-L | C2 | C3 | C4 | C5 | C6 | C7 |

FIG. 4

Table 4

| CMD | | CA0 | CA1 | CA2 | CA3 | CA4 | CA5 |
|---|---|---|---|---|---|---|---|
| Active-1 | A1-H | H | L | 0 | 1 | 0 | 1 |
| | A1-L | 1 | 0 | 1 | 0 | 0 | 1 |
| Active-2 | A2-H | H | H | 0 | 1 | 0 | 1 |
| | A2-L | 0 | 1 | 0 | 1 | 0 | 1 |
| Write-1 | W1-H | L | L | H | L | L | BL |
| | W1-L | 1 | 0 | 1 | V | 0 | AP |
| Read-1 | R1-H | L | H | L | L | L | BL |
| | R1-L | 1 | 0 | 1 | V | 0 | AP |
| Write-2 | W2-H/R2-H | L | H | L | L | H | 1 |
| Read-2 | W2-L/R2-L | 1 | 0 | 1 | 0 | 1 | 0 |

FIG. 5

Table 6

| CMD | | CA0 | CA1 | CA2 | CA3 | CA4 | CA5 | |
|---|---|---|---|---|---|---|---|---|
| Active-1 | A1-H | H | L | 0 | 1 | 0 | 1 | 0×2A |
| | A1-L | 0 | 1 | 0 | 1 | 0 | 1 | 0×2A |
| Active-2 | A2-H | H | H | 0 | 1 | 0 | 1 | 0×2A |
| | A2-L | 0 | 1 | 0 | 1 | 0 | 1 | 0×2A |
| Write-1 | W1-H | L | L | H | L | L | BL | |
| | W1-L | 0 | 1 | 0 | V | 0 | AP | 0×2A |
| Read-1 | R1-H | L | H | L | L | L | BL | 0×2A |
| | R1-L | 0 | 1 | 0 | V | 0 | AP | 0×2A |
| Write-2 | W2-H/R2-H | L | H | L | L | H | 1 | 0×2A |
| Read-2 | W2-L/R2-L | 0 | 1 | 0 | 1 | 0 | 1 | 0×2A |

FIG. 6

Table 7

| CMD | | CA0 | CA1 | CA2 | CA3 | CA4 | CA5 | |
|---|---|---|---|---|---|---|---|---|
| Active-1 | A1-H | H | L | 0 | 1 | 0 | 1 | 0×2A |
| | A1-L | 1 | 0 | 1 | 0 | 1 | 0 | 0×2A reverse |
| Active-2 | A2-H | H | H | 0 | 1 | 0 | 1 | 0×2A |
| | A2-L | 1 | 0 | 1 | 0 | 1 | 0 | 0×2A reverse |
| Write-1 | W1-H | L | L | H | L | L | BL | |
| | W1-L | 1 | 0 | 1 | V | 0 | AP | 0×2A reverse |
| Read-1 | R1-H | L | H | L | L | L | BL | 0×2A |
| | R1-L | 1 | 0 | 1 | V | 0 | AP | 0×2A reverse |
| Write-2 | W2-H/R2-H | L | H | L | L | H | 1 | 0×2A |
| Read-2 | W2-L/R2-L | 1 | 0 | 1 | 0 | 1 | 0 | 0×2A reverse |

FIG. 7

METHOD FOR GENERATING MEMORY PATTERN, COMPUTER-READABLE STORAGE MEDIUM AND DEVICE

CROSS REFERENCE TO RELATED APPLICATION

This disclosure claims the priority of China Patent Application No. 202010423910.6, filed on May 19, 2020 and entitled "method for generating memory pattern, computer-readable storage media and device", the contents of which are incorporated herein in its entirety as part of the disclosure.

TECHNICAL FIELD

The present disclosure relates to the technical field of semiconductor memory, in particular to a method for generating a memory address data, a computer-readable storage medium and a computer device.

BACKGROUND

LPDDR (low power double data rate SDRAM, i.e., low power double data rate synchronous dynamic random access memory), which is a kind of DDR SDRAM (double data rate synchronous dynamic random access memory), also known as mDDR (mobile DDR SDRAM), is a communication standard developed by JEDEC Solid State Technology Association for low-power memory, and it is known for its low power consumption and small volume and mostly used in mobile electronic products.

Generally, LPDDR consists of six command/address (CA) signal lines, among which the setting of pattern directly affects the results of the training, testing and verifying of LPDDR, while training, testing and verifying are almost all based on Memory Controller, that is, it can not control CA signal accurately.

SUMMARY

According to an aspect of the present disclosure, there is provided a method for generating a pattern of a memory, comprising:

- presetting mapping relationships between a physical address and a row, a column and a bank, and determining bits of the physical address corresponding to the row, the column and the bank;
- taking a preset number of values as setting data, the preset number being the same as a number of signal address lines in the memory;
- obtaining a command truth value table, the command truth value table is used to define relationships between bits of the physical address and commands;
- determining values of the row, the column and the bank based on the command truth value table and the setting data;
- generating the pattern based on the values of the row, the column and the bank and the mapping relationships.

According to another aspect of the present disclosure, there is provided a computer-readable storage medium on which a computer program is stored, wherein the program implements steps of the above-mentioned method when executed by a processor.

According to a further another aspect of the present disclosure, there is provided a computer device, including a memory, a processor and a computer program stored on the memory and run on the processor, wherein the processor implements steps of above-mentioned method when executing the program.

It should be understood that the above general description and the following detailed description are only exemplary and explanatory and do not limit the present disclosure.

BRIEF DESCRIPTION OF THE DRAWINGS

The drawings herein are incorporated into and form part of the specification, show embodiments in accordance with the present disclosure, and are used together with the specification to explain the principles of the present disclosure. It is obvious that the drawings in the following description are only some embodiments of the present disclosure. For those skilled in the art, other drawings can be obtained from these drawings without paying creative work.

FIG. 4 shows Table 2, which shows the relationship between each command in JEDEC and CA signal.

FIG. 5 shows Table 4, which shows a relationship between each command and CA signal.

FIG. 6 shows Table 6 and FIG. 7 shows Table 7, which show cases of using non-alternation (CA0-CA5 is 0×2A=101010b) and alternation (CA0-CA5 is 0×2A=101010b and ~0×2A=010101b) being obtained successively.

DETAILED DESCRIPTION

Figure 1:
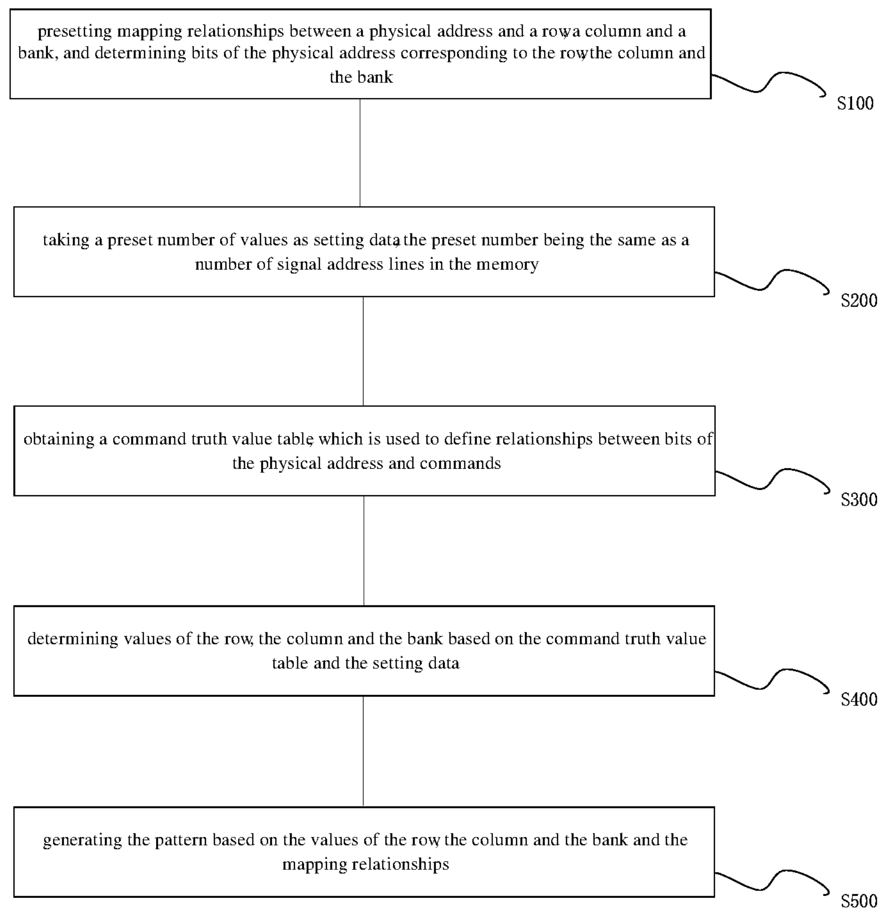
FIG. 1 is a flow chart of a method for generating a pattern of a memory provided by an embodiment of the present disclosure.

An example embodiment will now be described more fully with reference to the accompanying drawings. However, the example embodiments can be implemented in a variety of forms and should not be understood as being limited to the examples set forth herein; on the contrary, providing these embodiments makes the present disclosure more comprehensive and complete, and fully conveys the concept of the exemplary embodiments to those skilled in the art. The described features, structures or characteristics may be incorporated in one or more embodiments in any suitable manner In the following description, many specific details are provided to give a full understanding of the embodiments of the present disclosure. However, those skilled in the art will realize that the technical solutions of the present disclosure can be practiced without one or more of the specific details, or other methods, other steps, etc. can be adopted. In other cases, well-known technical solutions are not shown or described in detail to avoid overwhelming and confusing aspects of the present disclosure.

In addition, the drawings are only schematic diagrams of the present disclosure and are not necessarily drawn to scale. The same reference numerals in the figures denote the same or similar parts, and thus repeated description of them will be omitted. Some of the block diagrams shown in the figures are functional entities and do not necessarily correspond to physically or logically independent entities. These functional entities may be implemented in the form of software, or in one or more hardware modules or integrated circuits, or in different networks and/or processor devices and/or microcontroller devices.

Words “a”, “an”, “the” and “said” are used to indicate the existence of one or more elements/components/etc.; Words “include” and “have” are used to mean open inclusion, and mean that there may be other elements/components/etc. besides the listed elements/components/etc.

In this example embodiment, there firstly provided a method for generating a pattern of a memory, as shown in FIG. 1, including:

step S100, which presets mapping relationships between a physical address and a row, a column and a bank, and determines bits of a physical address corresponding to the row, the column and the bank;

step S200, which takes a preset number of values as setting data, the preset number being the same as the number of signal address lines in the memory;

step S300, which obtains a command truth value table, which is used to define relationships between bits of the physical address and commands;

step S400, which determines values of the row, the column and the bank based on the command truth value table and setting data;

step S500, which generates a pattern based on the values of the row, the column and the bank and the mapping relationships.

The method for generating pattern of a memory provided by the present disclosure can determine bits of a physical address corresponding to a row, a column and a bank by presetting mapping relationships between a physical address and the row, the column and the bank, then take a preset number of values as setting data, and then determine the values of the row, the column and the bank based on a command truth value table and the setting data, and then finally generates a pattern according to the values of the row, the column and the bank and the mapping relationships, so as to realize accurate control of CA signal according to the generated pattern, enhance the ability of training, testing and verifying of the memory, and improve the reliability of the results of training, testing and verifying of the memory.

Next, each step of the method for generating a pattern of a memory in the present exemplary embodiment will be further described.

In step S100, mapping relationships between a physical address and a row, a column and a bank is preset, and bits of a physical address corresponding to the row, the column and the bank is determined.

Figure 2:
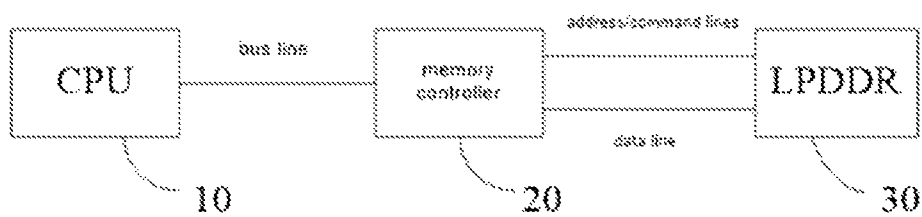
FIG. 2 is a data path block diagram provided by an embodiment of the present disclosure.

Specifically, the memory may be a low power double data rate synchronous dynamic random access memory (LPDDR). An exemplary description will be given taking LPDDR as an example in the following, but the specific types of the memory is not limited in the present disclosure. Among them, the setting of Pattern directly affects the results of the training, testing and verifying of LPDDR, and the training, testing and verifying are almost based on the Memory Controller 20, that is, the CA signal cannot be accurately controlled. The block diagram of data path from CPU 10 to LPDDR 30 (SDRAM) is shown in FIG. 2.

For example, assuming that the Pattern is 0×AAAAAAAA, the bus address and mapping relationships from bus to Row/Column/Bank of SDRAM are shown in Table 1.

TABLE 1

| address mapping from bus to SDRAM | bus address |
|---|---|
| Row | bit[29:14] |
| Bank | bit[13:11] |
| Colum | bit[10:1] |

In step S200, a preset number of values are taken as setting data, and the preset number is the same as the number of signal address lines in a memory.

For example, the CA signal line of LPDDR is 6, that is, the preset number is 6. Specifically, the initial data is obtained, and the values of the upper six bits, the middle six bits or the lower six bits in the initial data are taken as the setting data. Preferably, the lower six bits of the initial data are taken as the setting data, and it is more convenient to take the lower six bits.

In step S300, a command truth value table is obtained, which is used to define relationships between bits of the physical address and commands Specifically, a command truth value table is obtained, which is used to define relationships between bits of the physical address and commands, and the command includes at least one of an activation command, a read operation command and a write operation command. For example, there are six CA signal lines in LPDDR, which need to be sent/combined many times to complete corresponding functions (the relationship between each command in JEDEC and CA signal is shown in Table 2 (see FIG. 4), and those with shadow background cannot be modified). If a pattern (Pattern) is set in the traditional way, these patterns cannot be truly reflected in each CA signal.

Specifically, only the Row, the Column, and the Bank can be modified based on memory controllers. According to the above relationship, Table 3 is obtained (Hex, Bin being the address hex and binary, Addr being the pattern above, R/B/C being Row/Bank/Column).

TABLE 3

| Hex | A | | | | A | | | | A | | | | A | | | |
|---|---|---|---|---|---|---|---|---|---|---|---|---|---|---|---|---|
| Bin | 1 | 0 | 1 | 0 | 1 | 0 | 1 | 0 | 1 | 0 | 1 | 0 | 1 | 0 | 1 | 0 |
| Addr | 31 | 30 | 29 | 28 | 27 | 26 | 25 | 24 | 23 | 22 | 21 | 20 | 19 | 18 | 17 | 16 |
| R/B/C | R17 | R16 | R15 | R14 | R13 | R12 | R11 | R10 | R9 | R8 | R7 | R6 | R5 | R4 | R3 | R2 |
| | A | | | | A | | | | A | | | | A | | | |
| | 1 | 0 | 1 | 0 | 1 | 0 | 1 | 0 | 1 | 0 | 1 | 0 | 1 | 0 | 1 | 0 |
| | 15 | 14 | 13 | 12 | 11 | 10 | 9 | 8 | 7 | 6 | 5 | 4 | 3 | 2 | 1 | 0 |
| | R1 | R0 | B2 | B1 | B0 | C9 | C8 | C7 | C6 | C5 | C4 | C3 | C2 | C1 | C0 | |

The relationship between each command and CA signal is shown in Table 4 (see FIG. 5). The original intention is to make 0/1 alternation between each CA signal, but two zeros appear repeatedly. If the pattern is set to alternate (use pattern first, and then reverse pattern), it will not be satisfied. As shown in Table 4 (see FIG. 5), A1-H is set to pattern and A1-L is set to reverse pattern.

In step S400, the values of the row, the column, and the bank are determined based on the command true value table and the setting data.

Specifically, the commands are multiple, and each command contains at least two subcommands, and different subcommands have different fixed bits; When the subcommand has fixed bits of a first number, the value of a second number in the setting data is taken as the value of the bits of the physical address corresponding to the subcommand, and the sum of the first number and second number is a preset number.

For example, assume that the conditions are all in accordance with the above conditions (Pattern is still 0×AAAAAAAA), and the new pattern is 0×2A.

Among them, CA2-CA5 of A1-H corresponds to R12/R13/R14/R15, namely 0×5 (0101B), and based on Table 5, R12=1, R13=0, R14=1, R15=0.

TABLE 5

| Addr | 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|---|
| R/B/C | R17 | R16 | R15 | R14 | R13 | R12 | R11 | R10 | R9 | R8 | R7 | R6 | R5 | R4 | R3 | R2 |
| | 15 | 14 | 13 | 12 | 11 | 10 | 9 | 8 | 7 | 6 | 5 | 4 | 3 | 2 | 1 | 0 |
| | R1 | R0 | B2 | B1 | B0 | C9 | C8 | C7 | C6 | C5 | C4 | C3 | C2 | C1 | C0 | |

For example, the setting data is a binary number, and the low 6 bits of the setting data are taken to represent CA0, CA1, CA2, CA3, CA4 and CA5, and the CA5 is the minimum end; all operations based on memory controller 20 can be directly performed only a read-write operation. The read-write operation command includes the following subcommands Active-1, Active-2, Read-1, Read-2, Write-1 and Write-2. Each subcommand includes a Row, a Column and a Bank and what can be modified based on a memory controller are the Row, the Column and the Bank.

For A1-H, what can be affected are CA2-CA5. Take the lower 4 bits of the setting data, that is, the bit 0 of the setting data corresponds to R15 of the address signal, and the bit 1 corresponds to R14. According to the command truth value table relationship and so on, the relationship between the setting data and R12-R15 is determined respectively.

The relationship between each subcommand and the physical address is also set by A1-1, A2-H, A2-L, W1-H, W1-L, W2-H and W2-1 in accordance with the above method.

Specifically, the setting data is data with a first signal value and a second signal value arranged alternately. For example, a value of bits of physical address corresponding to all subcommands in a command true value table is determined according to the setting data, and the bits of the physical address correspond to at least one of a row, a column, and a bank. In case of non-alternation, the setting data is reversed to obtain a reverse data; in case of alternation, a value of bits of physical address corresponding to any adjacent subcommands in a command true value table is determined according to the setting data and the reversed data. The bits of physical address correspond to at least one of a row, a column, and a bank.

For example, as shown in Tables 6 (see FIGS. 6) and 7 (see FIG. 7), cases of using non-alternation (CA0-CA5 is 0×2A=101010b) and alternation (CA0-CA5 is 0×2A=101010b and ~0×2A=010101b) are obtained successively, thus obtaining the values of Row/Bank/Column.

In step S500, a pattern is generated based on the value of a row, a column and a bank and the mapping relationships.

Specifically, based on the values of each row, each column and each bank in the command truth value table, the values of each row, each column and each bank are sorted according to mapping relationships between the physical address and the row, the column and the bank, a pattern is obtained and is converted into a hexadecimal number.

For example, according to the obtained value of Row/Bank/Column, a pattern of a remapping address in non-alternation is: 0×15556CA8, as shown in Table 8; a pattern in alternation is: 0×165A9150.

TABLE 8

| Hex | 1 | | | | 5 | | | | 5 | | | | 5 | | | |
|---|---|---|---|---|---|---|---|---|---|---|---|---|---|---|---|---|
| Bin | 0 | 0 | 0 | 1 | 0 | 1 | 0 | 1 | 0 | 1 | 0 | 1 | 0 | 1 | 0 | 1 |
| Addr | 31 | 30 | 29 | 28 | 27 | 26 | 25 | 24 | 23 | 22 | 21 | 20 | 19 | 18 | 17 | 16 |
| R/B/C | R17 | R16 | R15 | R14 | R13 | R12 | R11 | R10 | R9 | R8 | R7 | R6 | R5 | R4 | R3 | R2 |
| | 6 | | | | C | | | | A | | | | 8 | | | |
| | 0 | 1 | 1 | 0 | 1 | 1 | 0 | 0 | 1 | 0 | 1 | 0 | 1 | 0 | 0 | 0 |
| | 15 | 14 | 13 | 12 | 11 | 10 | 9 | 8 | 7 | 6 | 5 | 4 | 3 | 2 | 1 | 0 |
| | R1 | R0 | B2 | B1 | B0 | C9 | C8 | C7 | C6 | C5 | C4 | C3 | C2 | C1 | C0 | |

Figure 3:
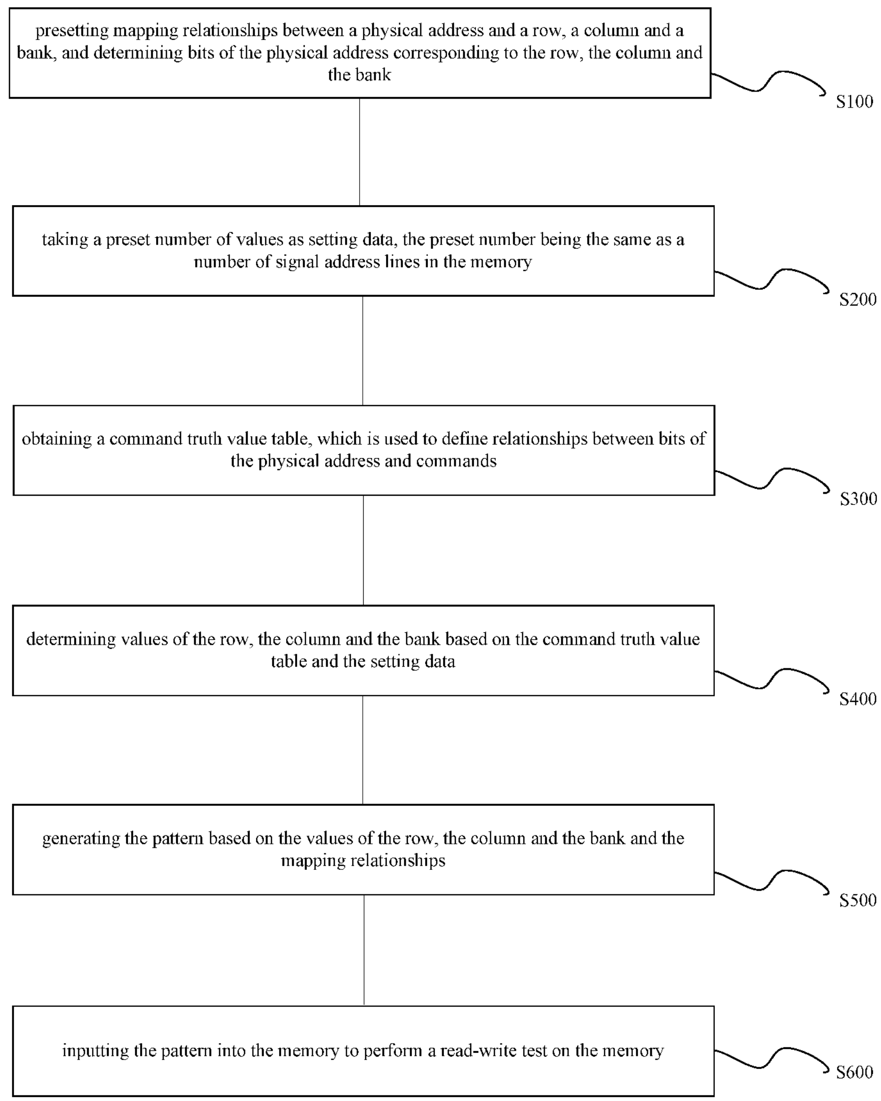
FIG. 3 is a flow chart of a method for generating a pattern of a memory provided by another embodiment of the present disclosure.

As shown in FIG. 3, a method for generating a pattern of a memory provided by the present disclosure also includes:

step S600, which input a pattern into a memory to perform a read-write test on the memory.

Specifically, the generated pattern is input into LPDDR for a read-write test. By regenerating a pattern to test the memory, the ability of training, testing and verifying of the memory is enhanced, and the reliability of the results of training, testing and verifying of the memory is improved.

The present disclosure also provides a computer-readable storage medium on which a computer program which realizes the method when being executed by a processor is stored.

The present disclosure also provides a computer device, including a memory, a processor and a computer program stored on the memory and run on the processor which can implement the steps of the method when executing a program.

In addition, although the steps of the methods of the present disclosure are described in a specific order in the drawings, it is not required or implied that these steps must be performed in that specific order, or that all the steps shown must be performed in order to achieve the desired results. Additionally or alternatively, some steps may be omitted, multiple steps may be merged into one step for execution, and/or a step may be decomposed into multiple step for execution, etc.

It is easy for those skilled in the art to understand through the above description of the embodiments. The example embodiments described here can be realized by software or by combining software with necessary hardware. Therefore, the technical solution according to the embodiment of the present disclosure can be embodied in the form of a software product, which can be stored in a non-volatile storage medium (which can be a CD-ROM, a U disk, a mobile hard disk, etc.) or on a network, including a number of instructions, so that a computing device (which can be a personal computer, a server, a mobile terminal or a network device, etc.) to perform a method according to an embodiment of the present disclosure.

Those skilled in the art will easily come up with other embodiments of the present disclosure after considering the description and practicing the invention disclosed herein. The present disclosure is intended to cover any variations, uses or adaptations of the present disclosure, which follow the general principles of the present disclosure and include common general knowledge or frequently used technical means in the technical field not disclosed in the present disclosure. The description and the embodiments are considered to be exemplary only, and the true scope and spirit of the present disclosure are indicated by the appended claims.

What is claimed is:

1. A method for generating a pattern of a memory, comprising:

presetting mapping relationships between a physical address and a row, a column and a bank, and determining bits of the physical address corresponding to the row, the column and the bank;

taking a preset number of values as setting data, the preset number being the same as a number of signal address lines in the memory;

obtaining a command truth value table, the command truth value table is used to define relationships between bits of the physical address and commands;

determining values of the row, the column and the bank based on the command truth value table and the setting data;

generating the pattern based on the values of the row, the column and the bank and the mapping relationships.

2. The method for generating the pattern of the memory according to claim 1, wherein the signal address lines include six signal address lines, and the taking a preset number of values as setting data comprises:

obtaining initial data; and taking values of upper six bits, values of middle six bits or values of lower six bits in the initial data as the setting data.

3. The method for generating the pattern of the memory according to claim 1, wherein the setting data is binary number.

4. The method for generating the pattern of the memory according to claim 1, wherein the commands comprise at least one of an activation command, a read operation command and a write operation command.

5. The method for generating the pattern of the memory according to claim 1, wherein the commands are multiple, and each command includes at least two subcommands, and different subcommands have different fixed bits;

the determining values of the row, the column and the bank based on the command truth value table and the setting data comprises:

when the subcommand has a first number of fixed bits, a second number of values in the setting data is taken as values of bits of a physical address corresponding to the subcommand, and a sum of the first number and the second number is the preset number.

6. The method for generating the pattern of the memory according to claim 5, wherein the setting data is data with a first signal value and a second signal value arranged alternately.

7. The method for generating the pattern of the memory according to claim 6, wherein the determining values of the row, the column and the bank based on the command truth value table and the setting data comprises:

determining values of the bits of the physical address corresponding to all subcommands in the command truth value table based on the setting data, the bits of the physical address corresponding to at least one of the row, the column and the bank.

8. The method for generating the pattern of the memory according to claim 6, wherein the determining values of the row, the column and the bank based on the command truth value table and the setting data comprises:

reversing the setting data to obtain reversed data; and determining values of bits of the physical addresses corresponding to any adjacent subcommands in the command true value table based on the setting data and the reversed data, the bits of the physical address corresponding to at least one of the row, the column, and the bank.

9. The method for generating the pattern of the memory according to claim 6, wherein the generating the pattern based on the values of the row, the column and the bank and the mapping relationships, comprises:

based on the values of each row, each column and each bank in the command truth value table, sorting the values of each row, each column and each bank according to the mapping relationships between the physical address and the row, the column and the bank, to obtain pattern.

10. The method for generating the pattern of the memory according to claim 9, wherein after obtaining the pattern, the method further comprises: converting the pattern into a hexadecimal number.

11. The method for generating the pattern of the memory according to claim 1, wherein after the generating the pattern based on the values of the row, the column and the bank and the mapping relationships, the method further comprises:

inputting the pattern into the memory to perform a read-write test on the memory.

12. The method for generating the pattern of the memory according to claim 1, wherein the memory is a low-power double data rate synchronous dynamic random access memory.

13. A computer-readable storage medium on which a computer program is stored, wherein the computer program implements step of the method according to claim 1 when executed by a processor.

14. A computer device, including a memory, a processor and a computer program stored on the memory and run on the processor, wherein the computer processor implements step of the method according to claim 1 when executing the computer program.

* * * * *